United States Patent [19]
Ross

[11] Patent Number: 5,402,073
[45] Date of Patent: Mar. 28, 1995

[54] NEAR-END COMMUNICATIONS LINE CHARACTERISTIC MEASURING SYSTEM WITH A VOLTAGE SENSITIVE NON-LINEAR DEVICE DISPOSED AT THE FAR END

[76] Inventor: Alan Ross, 11 Selby La., Palm Beach Gardens, Fla. 33418

[21] Appl. No.: 114,568

[22] Filed: Aug. 31, 1993

Related U.S. Application Data

[63] Continuation-in-part of Ser. No. 827,058, Jan. 28, 1992, abandoned.

[51] Int. Cl.[6] .................. G01R 31/02; H04M 3/26
[52] U.S. Cl. ...................... 324/539; 324/616; 379/26; 379/29
[58] Field of Search .............. 324/527, 534, 537, 539, 324/541, 616, 66; 379/21, 24, 26, 29, 30, 6

[56] References Cited

U.S. PATENT DOCUMENTS

| | | |
|---|---|---|
| 3,526,729 | 9/1970 | Andrews, Jr. et al. . |
| 3,660,620 | 5/1972 | Schimpf . |
| 3,663,769 | 5/1972 | Boatwright et al. . |
| 3,952,163 | 4/1976 | Couturier et al. . |
| 4,170,722 | 10/1979 | Blackburn . |
| 4,408,345 | 10/1983 | Yashiro et al. . |

*Primary Examiner*—Gerard R. Strecker
*Assistant Examiner*—Diep Do
*Attorney, Agent, or Firm*—David M. Klein; Bryan Cave

[57] ABSTRACT

A method and apparatus (3, 60, 202, 300) for measuring the dynamic, or alternating current, and static, or direct current, characteristics of a cable pair (2, 10, 24, 133) from one end, the local end, by utilizing an element (1, 19, 20) possessing known non-linear electrical characteristics connected across the other end, the remote end, together with methods and apparatus (30, 111) for connecting the non-linear element (1) across the remote end of the cable pair (2, 10, 24, 133) and disconnecting the non-linear element 11) by means of electrical voltages impressed across the cable pair (2, 10, 24, 133) at the local end. In the method and system of the present invention, the near end test set (3, 60, 202, 300) is electrically transposed to the far end of the cable pair (2, 10, 24, 133) making it appear, to be at the far end during the test while, physically remaining at the near end. The non-linear element (1), in its non-linear region, when suitably excited by two or more alternating signals of different frequencies (4, 12, 13, 41, 42, 113, 114), produces additional frequencies which travel back from the far end to the near end of the cable pair (2, 10, 24, 133) and are modified by the characteristics of the cable pair (2, 10, 24, 133). By selecting specific excitation frequencies and measuring the characteristics of the additional frequencies returned (6, 22, 52, 200), the characteristics of the cable (2, 10, 24, 133) can be deduced.

47 Claims, 5 Drawing Sheets

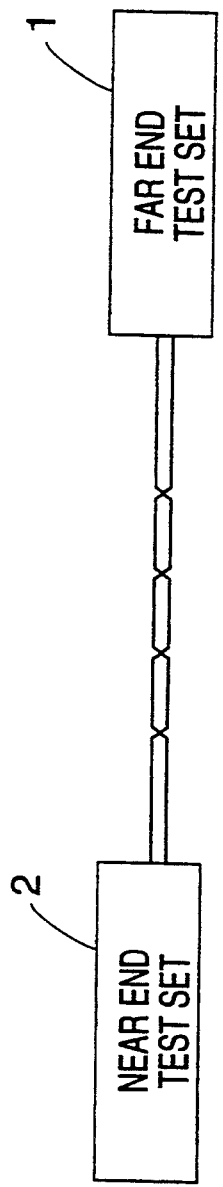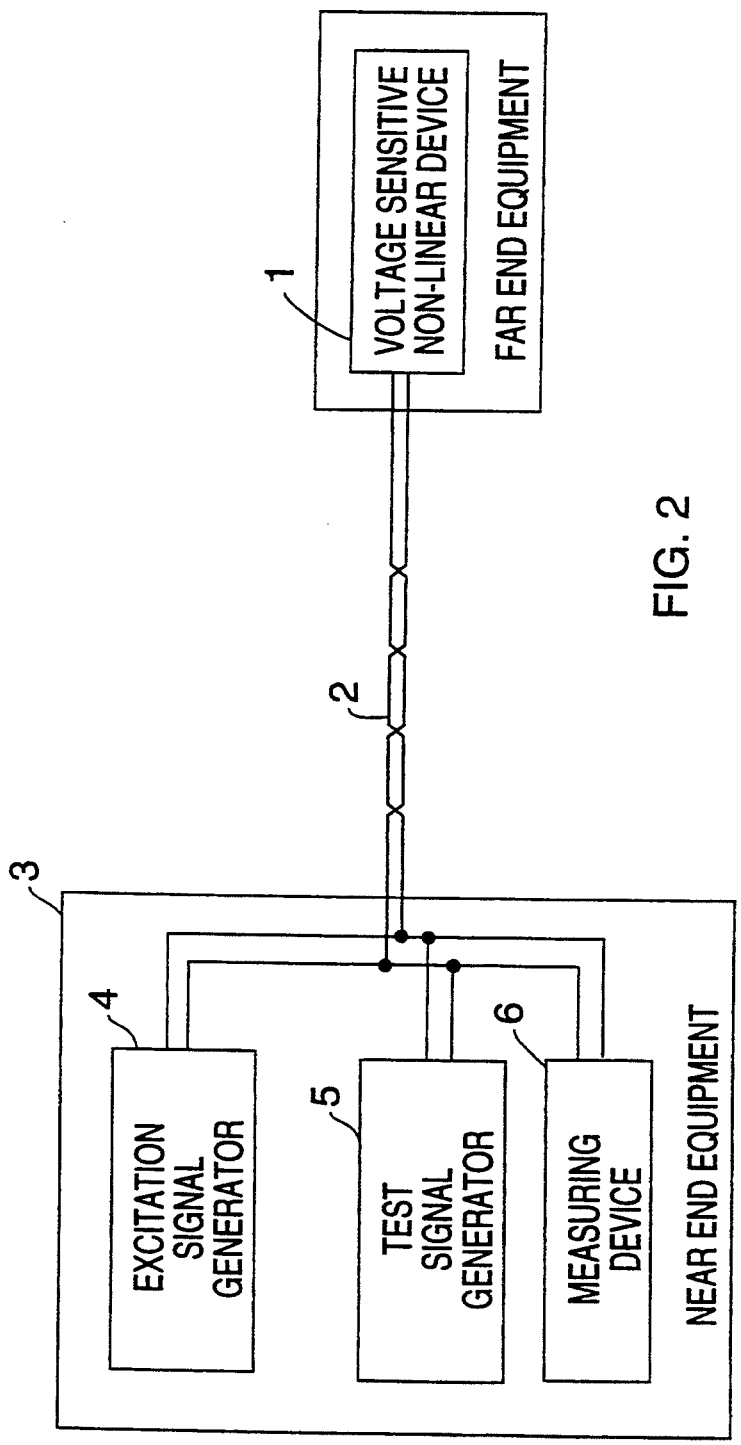

NEAR-END COMMUNICATIONS LINE CHARACTERISTIC MEASURING SYSTEM WITH A VOLTAGE SENSITIVE NON-LINEAR DEVICE DISPOSED AT THE FAR END

CROSS-REFERENCE TO RELATED APPLICATIONS

This is a continuation-in-part of U.S. application Ser. No. 07/827,058, filed Jan. 28, 1992, now abandoned.

FIELD OF THE INVENTION

The present invention relates to the measurement of cable pair AC and DC characteristics, as is normally required for the maintenance of telephone, cable television, communications, data, and computer networks.

BACKGROUND

Finding economical and efficient ways of testing the cables used in distributed networks (e.g. telephone systems) has been a problem since the first use of such networks. Historically, most prior testing methods could be represented generically by the configuration shown in FIG. 1. A test set was connected to the cable at each end. Testing was then done by exchanging signals between them. Typically, a far end set 1, i.e. telecommunications equipment located at a users location, would transmit a test signal and a near end set 2, i.e. testing equipment at the central station, would measure it. The data would then be recorded by an individual located at the near end. The test set 1, located at the far end, would be operated by an operator who had traveled to the far end, or would be controlled from the near end by an automatic device. Since typical telephone networks normally consist of many cables emanating from the near end (central telephone office) to many separate far ends (subscribers), these prior art methods normally require many separate far end test sets.

It was recognized in the prior art that traveling to the far end for testing was undesirable and, consequently, various prior art methods were employed for connecting and controlling the far end test set automatically in order to eliminate the need for a trip to the far end for testing. The principal difficulty with these prior art methods, however, was that they were both costly and complex, and they nevertheless, still had to have a test set and controller or operator waiting at each far end location.

Other systems were developed which enabled a device to be placed at the far end which is passive, but when excited from the near end returns a signal characteristic of the electrical conditions of the line. For example, Andrews et al, U.S. Pat. No. 3,526,729, discloses a system wherein a non-linear device, a diode, is placed across the line at the far end. An AC signal of constant frequency and known power is connected across the line at the near end and causes the diode to generate local harmonic signals to derive the conditions of the line at the remote location. Andrews uses a non-linear element to generate harmonics of a single signal. Andrews also discloses the use of two signals at once, wherein the harmonics of each signal is used independently.

Schimpf, U.S. Pat. No. 3,660,620 describes a similar configuration as Andrews. In addition to the first AC signal generator which generates a low frequency, high amplitude signal used to switch the alternatively into its conducting and non-conducting states, Schimpf also provides for an excitation signal generator located at the near end for generating a high frequency, low amplitude signal. These signals are amplitude modulated by the non-linear element, and the sum or difference frequencies are measured at the near end. Schimpf, uses the diode as a switch and is operated at amplitudes very close to those amplitudes used to cause ringing.

These systems have certain practical defects which render them impractical. Firstly, such systems do not isolate the far end equipment from the line while the line is being tested. This causes several possible problems with such systems.

The Schimpf design, specifically requires a signal of peak-to-peak amplitude at least equal to that of ringing voltage so that the voltage regulator (zener) diode will conduct on alternate cycles. This is undesirable, since ringing of telephones on the line would result if a signal of ringing frequency and amplitude was applied to the pair. This might also load the ringing voltage to the point that no guarantee could be given that the ring voltage would turn on the zener diode.

Also, even if a signal outside ringing frequency were used in the Schimpf invention, the electronic ringers commonly used on today's telephones would still ring. If the signal were too far outside the acceptable ringing frequency range, it might also couple with other pairs causing unacceptable interference with other calls. The Schimpf invention generates a returned frequency which is measured at the near end as a sum or difference frequency by amplitude modulation of the measurement signal frequency with the excitation signal frequency. The practical need for using a very low frequency excitation signal, since the ringing signal is confined the 16–66 Hz frequency band, places the returned signal close in frequency to the measurement signal. This causes two problems:

a) the measured signal travels the pair twice, first in the near-far direction at the measurement signal frequency, and then in the far-near direction as a returned sideband signal. Since these two signals are close in frequency, differing only by the excitation signal frequency, they experience the same attenuation in each direction. This doubles the dB loss between the measurement signal sent and the measuring signal returned, making the returned signal of very low amplitude, which is more difficult to measure with the frequency selective voltmeter, especially in a noisy environment. The measurement range of Schimpf is thus limited severely by the noise on the pair.

b) Both the unattenuated measuring signal and the returned measurement signal (lower by 9 dB plus twice the line loss) are present on the test pair at the input to the frequency selective voltmeter. Since these two signals are very close in frequency, differing only by the excitation signal frequency, they require a very finely tuned filter, which adds to its complexity.

c) The returned signal is directly related to the measurement signal frequency, and is thus different for every measurement frequency. This necessitates multiple filters or a tunable filter, if measurements at more than one frequency are to be made, as in slope measurement.

The present invention overcomes the disadvantages of the prior art, both as to the need for personnel and/or complex and costly equipment at the far end and employs an approach which electrically transposes the near end test set to the far end of the cable, making it appear, for all intents and purposes, to be at the far end during the test while, in reality, physically remaining at the near end. Furthermore, the present invention overcomes the practical disadvantages of the prior art systems which utilize a non-linear element at the far end. Thus, the present invention permits one test set to be used at the near end for the testing of many cables emanating from the near end, thus eliminating the need for far end test sets and the complex and costly equipment at the far end used for connection and remote control.

SUMMARY OF THE INVENTION

The present invention relates to a method and system for measuring the alternating current and direct current characteristics of a cable pair, such as a telephone cable pair or a cable pair used to carry signals in a LAN (local area network) or similar signals, entirely from one end of the cable by utilizing non-linear devices connected to the other end. Such devices, when suitably excited by two or more alternating current signals of different frequencies, produce additional frequencies through harmonic mixing. In the present invention, the non-linear device is placed at the remote or far end of the cable pair, and is excited by frequencies that are impressed on the cable pair from the other (local) or near end. The exciting frequencies travel the length of the cable pair in the direction from the local or near end to the remote or far end and are modified as they do so by the characteristics of the cable, and the additional frequencies produced by harmonic mixing at the remote end travel back from the remote end to the local end and are also modified by the characteristics of the cable. By selecting specific excitation frequencies and measuring the characteristics of the additional harmonically generated frequencies returned, the characteristics of the cable can be deduced with great accuracy.

In one embodiment of the present invention, the non-linear device is permanently connected across the cable pair and constructed in such a manner that it becomes non-linear only in the presence of alternating current voltages larger than those usually present on the cable pair in normal operation, and measurements are initiated by impressing larger than normal voltages on the cable pair from the local or near end.

In another embodiment of the present invention, the non-linear device is isolated from the cable pair by a second non-linear device, such as a zener diode or silicon controlled rectifier (SCR), so that it may be caused to be connected across the cable pair only when a direct current voltage of suitable magnitude and polarity is impressed across the cable pair, and measurements are initiated by impressing a combination of alternating current and direct current voltages across the cable pair simultaneously. This enable the line to be tested in the presence of loop current, i.e. under normal operating conditions for the line, which was not possible in prior art systems. In this embodiment, a load isolation circuit electrically isolates the far end telecommunications equipment from the testing signals and circuitry during testing, while not affecting normal operation of the telephone system in the absence of the test signals.

In either case the measurement apparatus may be located only at the local or near end, and all measurements can thus be made entirely at the local end.

BRIEF DESCRIPTION OF THE DRAWINGS

FIG. 1 is a block diagram illustrative of prior art testing systems.

FIG. 2 is a block diagram of the presently preferred measurement system in accordance with the present invention.

DETAILED DESCRIPTION OF THE INVENTION

Figure 3:
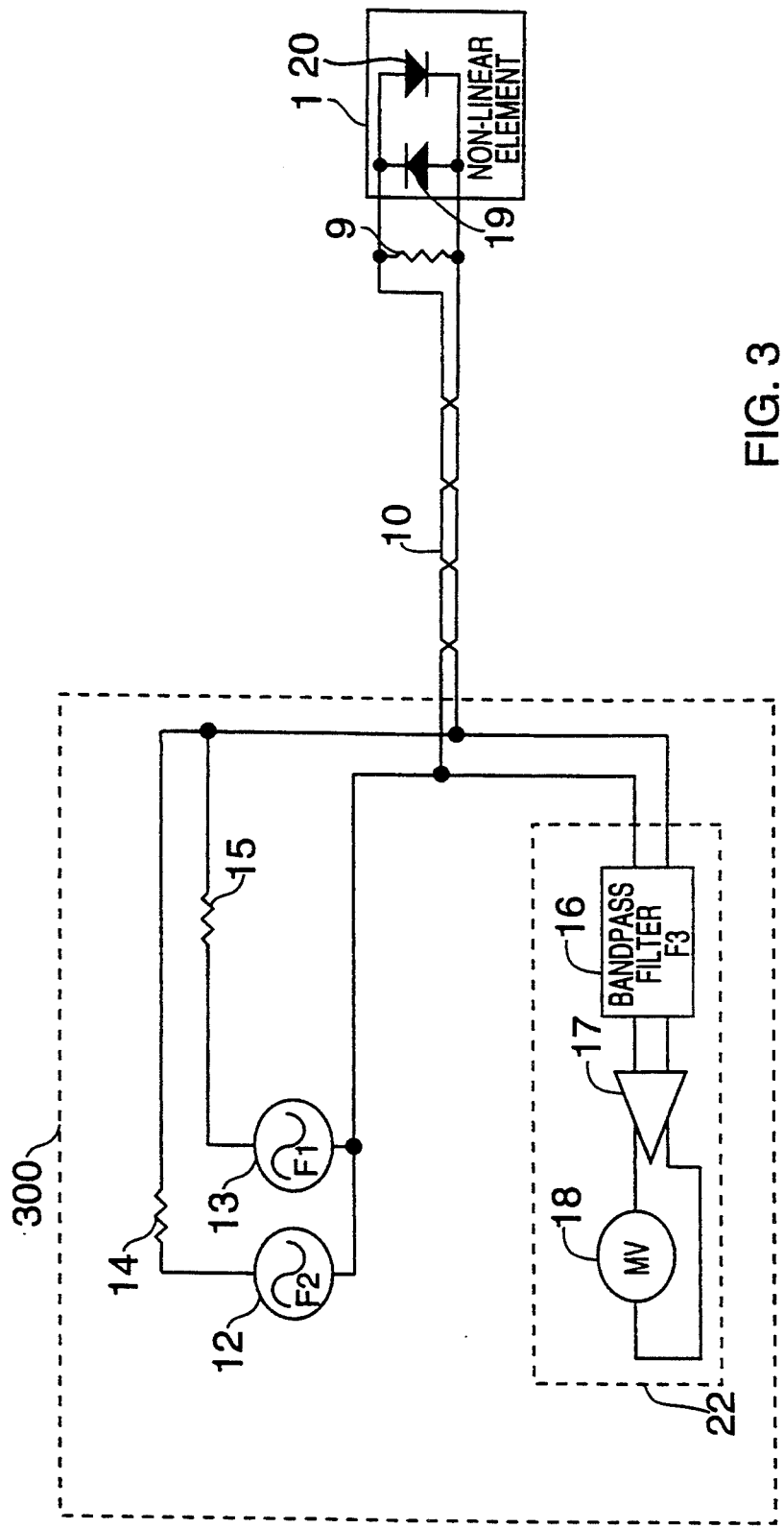
FIG. 3 is a block diagram, partially in schematic, illustrating a method and system in accordance with the present invention in which a non-linear element is connected across one end of the cable pair and is excited by two known alternating current signals of different frequencies and magnitudes, while the resultant returned frequencies are filtered and measured to determine the loss through the cable at one of the two exciting frequencies.

Referring now to the drawings in detail, and initially to FIG. 2 thereof, the basic arrangement of the present invention is illustrated. As shown and preferred in FIG. 2, in order to transpose the near end test set to the far end, preferably a voltage sensitive non-linear device 1 is employed which is connected across the cable pair 2 at the far end. Such a non-linear device 1, such as a pair of diodes 19, 20 (FIG. 3), is very inexpensive. Other types of non-linear devices, such as a single diode, diode bridge, diode rings and others are well known in the art. Such devices can be easily connected and disconnected, and not require power, the presence of an operator, or the use of a remote control device.

The non-linear device may be any device with an instantaneous impedance that is a function of the voltage impressed across it, or the current passing through it, or both. Such devices, as shown herein can predictably be made to produce new signals of known frequencies by harmonic mixing when excited by two or more specific signals.

The non-linear element is driven to its non-linear region (i.e. the point at which the non-linear device's impedance will vary with applied voltage) when an exciting signal of sufficient magnitude is provided across it. When an exciting signal provides a time varying voltage across the non-linear element, this causes the non-linear element's impedance to vary in a manner determined by the specific non-linearity inherent in the device and the time variation of the exciting signal. The exciting signal forces the non-linear element's impedance to vary with time in synchronism with the exciting signal.

Similarly, the test signal also causes the non-linear elements impedance to vary in a manner that is in synchronism with its instantaneous voltage. The exciting signal is made much larger than the test signal, so that its' effects will predominate.

The impedance variations in the non-linear element caused by the exciting and test signals cause non-linear current flow which causes their voltage waveform to become distorted. This distortion causes harmonics of the signal frequencies to appear in the current flowing in the non-linear device. The current flowing in the non-linear device then contains not only the fundamental frequencies of both the exciting and test signals, but also new harmonic frequencies. The magnitude of these new frequencies is a predictable and repeatable function of the amplitudes of the exciting signal and test signal.

A second effect is caused by impedance variations in the non-linear element; amplitude modulation. Amplitude modulation produces sidebands on one signal offset by the modulating frequency of the other. These sidebands appear as a new series of sum and difference signals in the current flowing in the non-linear device. As previously described, amplitude modulation was used in prior art devices, and results in deficiencies in such systems which are overcome by the present invention.

The returned signals generated by harmonic mixing due to the non-linear device are at predictable but different frequencies from the applied signals and can be separated by filters for measurement. The amplitudes of these returned signals are dependent on the characteristics of the cable pair, so the characteristics of the pair can be determined from the amplitudes of the returned signals, making characterization of the cable pair possible.

In the system and method of the present invention, the near end equipment 3 preferably consists of three devices: an excitation signal generator 4 which preferably excites the voltage sensitive non-linear device 1, causing it to become non-linear in a known manner, a test signal generator 5 which preferably generates the test signals used to measure the cable characteristics of the cable pair 2 in conjunction with the non-linearity, and measuring device 6 which preferably comprises a frequency selective voltmeter.

The presently preferred operation of the system illustrated in FIG. 2 is as follows. The excitation generator 4 preferably generates a signal of sufficient amplitude to drive the voltage sensitive non-linear device 1 into its non-linear region. The voltage level required to do this is preferably larger than the voltage levels normally used to transmit signals through the cable pair 2. Preferably, while the non-linear device 1 is in its non-linear region, such as, preferably, simultaneously as with the excitation signal, the test signal generator 5 generates one or more low level signals at the frequencies required for measurement. The level of these test signals is preferably much lower than the level of the excitation signal generated by excitation generator 4 and does not contribute significantly to the non-linearity of the voltage sensitive non-linear device 1. The resulting non-linearity appearing at the far end of the cable pair 2 as a result of the excitation signal from the excitation signal generator 4 preferably causes a new frequency to be generated at the far end of the cable pair 2. This frequency preferably travels from the far end to the near end via the cable pair 2 and is preferably measured by the frequency selective measuring device 6. Preferably, a known calibration signal would have been previously employed in order to obtain the known original characteristics of the system. As a result, the characteristics of the cable pair 2 can then be readily determined using the above preferred system since the characteristics of the measured signal are the product of its known original characteristics, as generated by the excited voltage sensitive non-linear device 1, and the characteristics of the cable pair 2. Thus, the measurements obtained in accordance with the preferred system and method of the present invention reveal the characteristics of the cable pair 2 in exactly the same manner as if the test signal generator 5 was physically located at the far end.

Referring now to FIG. 3, FIG. 3 illustrates the basic configuration of the present invention for measurement of the attenuation versus frequency characteristics of a cable pair 10 in which the non-linear element 1 preferably consists of two diodes 19, 20 connected in parallel with their forward directions opposite to each other, and with this diode pair 19, 20 being connected in parallel with a resistor 9 across one end of the cable pair 10. Two separate sinusoidal signal generators 12 and 13 are preferably connected in parallel across the opposite end of the cable pair 10. A pair of resistors 14 and 15, each preferably equal to twice the characteristic impedance of the cable 10, preferably serve to match the generators 12, 13 to the cable 10. Also, preferably, connected across the opposite end of the cable pair 10 is a frequency selective voltmeter 22 preferably consisting of a bandpass filter 16, an amplifier 17, and a voltmeter 18. The voltmeter 18 is preferably sensitive only to signals at a predetermined frequency F3. The frequency selective voltmeter 22 and the signal generators 12, 13 preferably comprise a testing circuit 300.

Sinusoidal signal generator 13 is preferably normally set to provide a large amplitude signal at a frequency F1, so that the non-linear element 1 is preferably driven into its non-linear regions, and sinusoidal signal generator 12 is preferably normally set to provide a low amplitude signal at a frequency F2, so as preferably not to drive the non-linear element 1 into its non-linear regions. In any case, it is preferred that the amplitudes of F1 and F2 be of a low enough level so as not to cause ringing to occur on the line.

Under the presently preferred conditions for the signal generators 12, 13, two primary signals are generated by the non-linear element 1 and returned to the bandpass filter 16. The frequencies of the two signals preferably can be calculated according to the following formula:

$$F3 = N*(F1) + F2$$

and $$F3 = N*(F1) - F2$$

where N is any odd whole number.

Either of the two frequencies can preferably be used to determine the characteristics of the cable pair 10. Very low frequencies are preferably selected for F1 and F3 so that the attenuation of the cable pair 10 at frequencies F1 and F3 is very low so as to be negligible, and F2 is then the frequency at which the measurement of attenuation is to be made. Thus, given the resistance of the cable pair 10, which can readily be determined by measurement or from a calculation utilizing the length of the cable pair 10 and the wire size, the frequency response and resistive loss of the cable pair 10 can preferably be determined from the measurement of the returned signal at frequency F3 as indicated by the voltmeter 18.

For example, to measure the loss of a telephone cable pair 10 when frequency F2 equals 304 Hz, 1004 Hz, and 2804 Hz, respectively, the following results are obtained, using the above formula, as shown below in Table A:

TABLE A

| F1 | N | N*(F1) | F2 | F3 |
|---|---|---|---|---|
| 99.00 Hz | 1 | 99 Hz | 304 Hz | 215 Hz |
| 263.00 Hz | 3 | 789 Hz | 1004 Hz | 215 Hz |
| 369.85 Hz | 7 | 2589 Hz | 2804 Hz | 215 Hz |

It should be noted that, in accordance with the present invention, preferably, the frequency of the returned signal F3 is constant and is low enough not to be affected by the frequency response of the cable pair 10. Thus, its loss in traveling from the non-linear element 1, where it is generated, to the frequency selective voltmeter 22 can be calculated from the known cable pair 10 resistance and the known values of terminating resistors 14 and 15.

Figure 4:
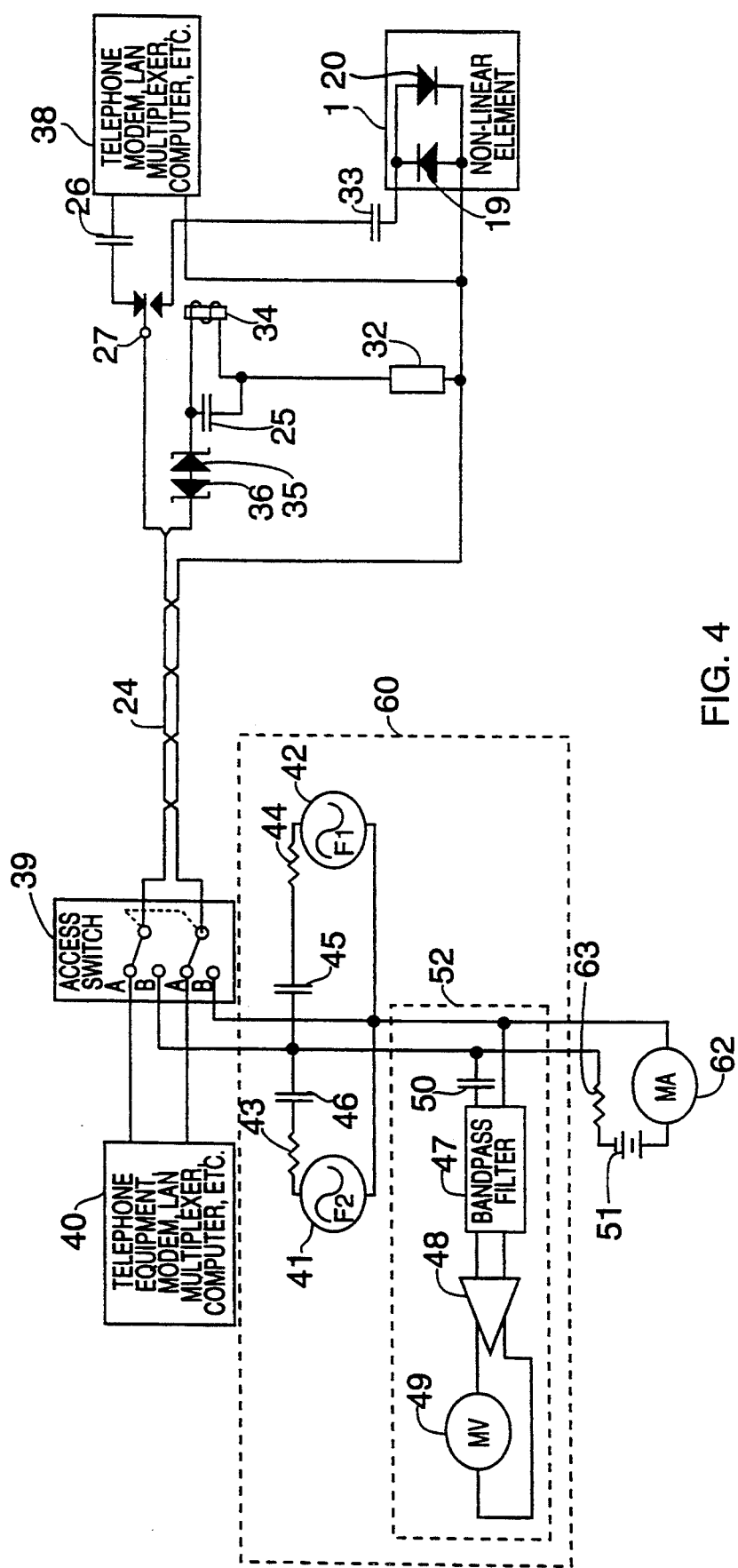
FIG. 4 is a block diagram, partially in schematic, of an alternative embodiment of the method and system of FIG. 3 in which the cable pair to be tested is accessed, the non-linearity is connected across the other end by the application of a direct-current voltage, and the dynamic characteristics of the cable are then measured.

Additionally, the non-linear circuit 1 conversion factor, that is, the ratio of the level of signal F3 returned to the level of F2 impressed, is preferably known from the design of the non-linear element 1. In addition to the above, preferably the amplitude of F1 is not significant since it is always preferably large enough to drive the non-linear element 1 into its non-linear regions. Thus, the attenuation of the cable pair 10 at frequency F2 can preferably be calculated from the level of F2 impressed on the cable pair 10 by sinusoidal signal generator 12 and the measured level of returned signal F3 according to the following formula:

Attenuation at $$F2 = (Vm/Vi), (1/K), ((Rt+Rs)/Rt)$$

where Vm is the measured level of F3,
and Vi is the impressed level of F2,
and K is the conversion factor of the non-linear element 1 for the used value of N,
and Rs = the cable pair 10 series resistance,
and Rt = the cable pair characteristic impedance Referring now to FIG. 4, FIG. 4 illustrates a preferred embodiment of the present invention in which the non-linear element 1 is preferably connected in series with a blocking capacitor 33, which serves to isolate it from any applied direct current voltages, and the resulting circuit is then preferably connected across the remote end of the cable pair 24 through normally open relay contacts 27 when a relay coil 34 is energized. Preferably, the relay coil 34 is part of a series circuit, consisting of the relay coil 34, a resistor 32 and two zener diodes 35 and 36, with their forward directions opposite to each other which is connected across the remote end of the cable pair 24. A capacitor 25 is also preferably provided in order to bypass the inductance of the relay coil 34, thereby rendering it a low impedance for alternating current signals. The normally closed contacts 27 of the relay 34 are preferably connected in series with the normal remote load 38 on the cable pair 24, which may consist of a telephone, modem, LAN, multiplexor or any device normally used with a cable pair 24. Preferably, an additional capacitor 26 is provided in order to isolate any direct current voltages on the cable pair 24 from the remote load 38.

As further shown and preferred in FIG. 4, the local end of the cable pair 24 terminates in an access switch 39, such as the type well known in the art. During normal use, this access switch 39 is preferably in position A and connects the local end of the cable pair 24 to the normal local load 40 at the local end. This local load 40 preferably consists of a device normally used to communicate with the device that terminates the remote end of the cable pair 24, and is well known in the art. In accordance with the system and method of the present invention, when it is desired to test the cable pair 24, the access switch 39 is preferably operated by moving it to position B. This disconnects the normal load 40, replacing it with the testing circuit 60. The testing circuit 60 preferably consists of two separate sinusoidal signal generators 41 and 42 connected in parallel across the cable pair 24, a pair of resistors 43 and 44, each preferably equal to twice the characteristic impedance of the cable pair 24, which preferably serve to match the signal generators 41, 42 to the cable 24, and a pair of capacitors 45 and 46 which preferably block any direct current voltage from the sinusoidal signal generators 41, 42. Also preferably connected as a part of the testing circuit 60 is a frequency selective voltmeter 52 preferably consisting of a bandpass filter 47, an amplifier 48, and a voltmeter 49. Preferably, this voltmeter 49 is sensitive only to signals at frequency F3. A capacitor 50 is also preferably provided in order to block any direct current voltages from the bandpass filter 47.

Preferably, during normal operation of the embodiment illustrated in FIG. 4, the local load 40 is connected to the remote load 38 via the cable pair 24, and zener diodes 35 and 36 isolate the testing circuitry 60 from the cable pair 24, since the normal operational voltages are preferably not large enough to cause either zener diode 35, 36 to conduct. When testing access is made by operating the access switch 39, a battery 51 preferably impresses a direct current voltage across the cable pair 24 via a protective current limiting resistor 63. This voltage preferably forward biases one of the two zener diodes 35 and 36, and causes the other to conduct. The resulting current then flows through an ammeter 62, both zener diodes 35, 36, and through relay coil 34 and resistor 32. Relay contacts 27 are, thus, caused to transfer, disconnecting the normal remote load 38 from the cable pair 24 and connecting the non-linear element 1 across the cable pair 24, thus permitting the measurements of the characteristics of the cable pair 24 in the manner described with reference to FIG. 3. Additionally, since the resistance of relay coil 34, resistor 32, and current limiting resistor 63 are known, as is the voltage drop across the zener diode pair 35, 36, the series resistance of the cable pair 24 can readily be calculated from ohms law, as is well known in the art. This makes it possible to solve the previously referred to formulas utilized with the embodiment of FIG. 3, and, thus, derive all of the needed results without any other outside information about the cable pair 24.

Figure 5:
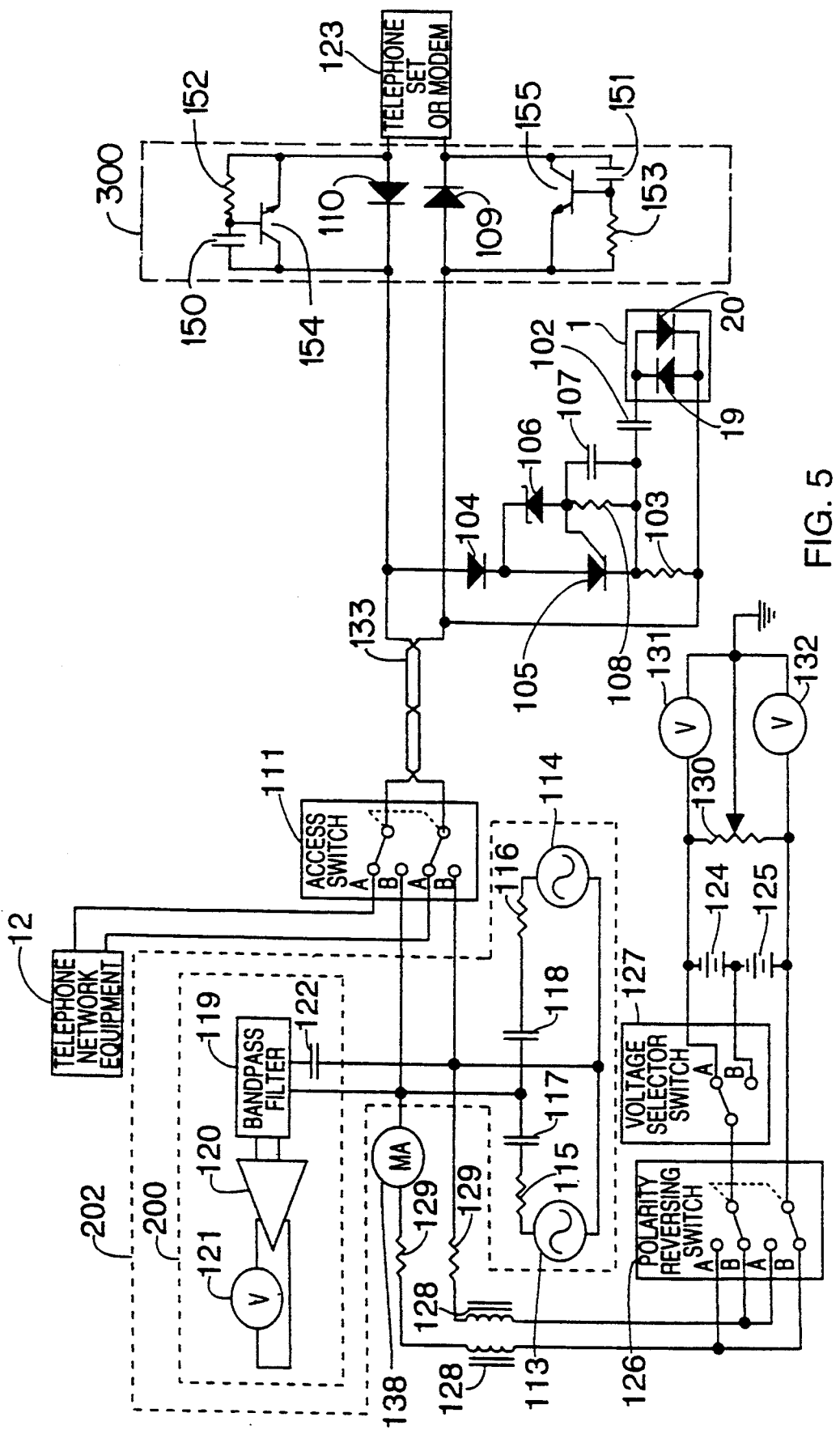
FIG. 5 is a block diagram, partially in schematic, of another alternative embodiment of the method and system of FIG. 3 in which the cable pair is accessed, the non-linear element is connected across the remote end by activating an SCR with various voltage pulses, and the static and dynamic characteristics of the cable, including balance, are then measured. Also shown is a circuit for isolating the subscriber set during testing.

Referring now to FIG. 5, FIG. 5 illustrates another preferred embodiment of the present invention in which the non-linear element 1 is connected across a resistor 103 through a blocking capacitor 102, with the overall function of this embodiment, nevertheless, preferably being as described with respect to FIG. 3, although the circuit arrangement is different in detail. In this regard, the resultant circuit is preferably connected across the remote end of the cable pair 133 through a circuit consisting of a series diode 104 and a silicon controlled rectifier (SCR) 105. This circuit will preferably conduct only when the polarity of the applied direct current voltage is such that the anode of the diode 104 is positive, and then only after the applied voltage is large enough to cause a zener diode 106 to conduct and trigger the SCR 105. Once the SCR 105 has been triggered, the circuit preferably becomes a low impedance and continues to conduct until the applied direct current voltage is removed or its polarity is reversed. The orientation of the diode 104 and the rest of the circuit is preferably reversed with respect to the polarity of the direct current voltage across the cable pair 133 that is present during normal operation of the circuit. A resistor 108 and a capacitor 107, are preferably provided in order to maintain the impedance required by the trigger input of the SCR 105, thus ensuring that it will not conduct unless the zener diode 106 conducts. The zener diode 106 is preferably selected to conduct at a voltage slightly larger than the largest voltage encountered when the local load device 112 and the remote local device 123 are connected together via the cable pair 133 and are operating normally. Thus, reversing the polarity of the applied direct current voltage and increasing its magnitude until the zener diode 106 conducts will preferably turn on the SCR 105. Once the SCR 105 conducts, it preferably becomes a low impedance and connects both the non-linear element 1 and the resistor 103 across the cable pair 133. This results in DC current flow through the the cable pair, which is known as loop current, and permits the measurement of the DC resistance of the cable 133 under actual conditions of operation, i.e. with loop current flowing. This also enables the measurement of the cable 133 characteristics in the manner previously described with reference to FIG. 3 while in the presence of loop current, thus characterizing the cable 133 under conditions that correspond realistically to the conditions of actual use of cable 133.

As further shown and preferred in FIG. 5, the local end of the cable pair 133 preferably terminates in an access switch 111, such as the type well known in the art. Preferably, during normal use of the system of FIG. 5, the access switch 111 is in position A, and connects the local end of the cable pair 133 to its normal local load 112, which preferably consists of a device, such as telephone network equipment, normally used with the remote load device 123, such as a telephone set or modem, that terminates the remote end of the cable pair 133, and is well known in the art. During normal operation, local load device 112 preferably supplies a direct current voltage to the cable pair 133, which is preferably normally used to supply the current used to power the remote load device 123. This voltage preferably forward biases diodes 109 and 110, part of load isolation circuit 300, whose function is to connect/disconnect remote load device 123 from cable pair 133.

Load isolation circuit 300 preferably functions as follows: when the DC voltage applied to cable pair 133 is of such polarity that diodes 109 and 110 are forward biased, then diodes 109, 110 preferably become a low impedance, permitting the flow of both AC and DC current through remote load device 123. One of the signals impressed on cable pair 133 during normal use is a high voltage low frequency signal known as Ringing Voltage, whose function is to ring the bell on a telephone set that preferably may compromise remote load device 123. This voltage may be of sufficient amplitude as to allow reverse cycles of the ringing voltage to overcome the DC voltage applied to cable pair 133, causing a polarity reversal that causes diodes 109 and 110 to be reversed biased. The diodes 109, 110 then become a high impedance, preventing the flow of ringing voltage to load device 123. When this occurs resistors 152 and 153 maintain the emitter-base voltage of transistors 154 and 155 at zero. The reversed polarity due to the ringing voltage is then impressed across the emitter-base diodes of transistors 154 and 155, through capacitors 150 and 151. Since the ringing voltage is a large amplitude signal it is sufficient in amplitude to exceed the emitter-base voltage required to turn on transistors 154 and 155, causing them to conduct, becoming a low impedance allowing the AC ringing voltage to flow through remote load 123.

When the DC voltage applied to cable pair 133 is of such a polarity that diodes 109 and 110 are reversed biased then diodes 109 and 110 become a high impedance, disconnecting remote load 123 from cable pair 133. In this mode of operation ringing voltage is never applied to cable pair 133, and any signal voltages applied to transistors 154 and 155 through capacitors 150 and 153 are not sufficient to exceed the emitter-base voltage required to turn on the transistors 154, 155. Remote load 123 is thus disconnected from cable pair 133.

When it is desired to test the cable pair 133 in accordance with the present invention, the access switch 111 is preferably operated by moving it to position B, and it then preferably disconnects the normal local load 112, replacing it with the testing circuit 202. As shown and preferred, testing circuit 202 preferably consists of two separate sinusoidal signal generators 113, 114 connected in parallel across the cable pair 133, a pair of resistors 115, 116, each preferably equal to twice the characteristic impedance of the cable pair 133, and which preferably serve to match the signal generators 113, 114 to the cable pair 133, and a pair of capacitors 117, 118 which preferably block any direct current voltage from the sinusoidal signal generators 113, 114. Also, preferably connected across the opposite end of the cable pair 133 is a frequency selective voltmeter 200, which preferably consists of a bandpass filter 119, an amplifier 120, and a voltmeter 121. This voltmeter 121, as in the previously described embodiments, is preferably sensitive only to signals at frequency F3. A capacitor 122 preferably blocks any direct current voltages from the bandpass filter 119.

In addition, as further shown and preferred in FIG. 5, a direct current voltage is impressed across the local end of the cable pair 133 from a pair of power sources 124, 125, which may be batteries or any suitable DC power supplies, such as are well known in the art, through a polarity reversing switch 126 which preferably serves to reverse the polarity of the impressed voltage as required, and through a voltage selector switch 127 by means of which the magnitude of the impressed voltage can be set to either one of two values. Initially, a potentiometer 130 is preferably set to the center of its range so that the impressed voltages are balanced with respect to ground. As further shown and preferred, a pair of inductors 128 are connected to the polarity reversing switch 126 and present a high impedance at the frequencies of the alternating current voltages utilized to measure the cable pair 133 characteristics, such as described with reference to FIG. 1, with a pair of current limiting resistors 129 also being provided to act as protective current limiters.

Preferably, initially after access device 111 is operated, disconnecting the normal local load 112, and, thus, removing the direct current voltage it supplies, switches 126 and 127 are operated in such a manner as to supply a direct current voltage of the same polarity and magnitude as that used during normal operation, with polarity reversing switch 126 being in position B as is voltage selector switch 127. A current meter 138 is then preferably observed. If there is no current, everything is normal. If current is observed flowing, then there are two possibilities: either the cable pair 133 has a short circuit across it, or the remote load device 123 is drawing current.

Polarity reversing switch 126 is then, preferably operated, moving it to position A, to reverse the applied voltage, thus reverse biasing diodes 109 and 110, which are part of load isolation circuit 300. These diodes 109 and 110 then preferably become a high DC impedance, disconnecting the remote load device 123 from the cable pair 133. However, the resulting voltage is preferably not high enough to activate the zener diode 106, so SCR 105 is not triggered and the testing circuit 202 does not draw any current. Current meter 138 is then preferably observed. If current is still flowing, the cable pair 133 is shorted. This is reported as a fault, the access device 111 is returned to its normal position and testing ceases. If current is not observed to be flowing, then the remote load device 123 is reported faulty and testing continues.

Voltage selector switch 127 is then preferably operated in such a manner as to momentarily increase the applied voltage to a value large enough to cause the zener diode 106 to conduct and then return the applied voltage to the same magnitude as used during normal operation. This is preferably done by moving the voltage selector switch 127 to position A and then returning it to position B, thus triggering the SCR 105. Current meter 138 is, then, preferably, once again observed. If current is observed to be flowing, everything is normal, and the resistance of the cable pair 133 is calculated from the value of the current and the known values of series resistors 129, the applied voltage, the known voltage drops across diode 104 and the SCR 105 and the known value of load resistor 103 by using ohms law, which is well known in the art. If no current is observed to be flowing, then the cable pair 133 must be open. This is reported as a fault, the access device 111 is returned to its normal position, and testing ceases.

Once the series resistance of the cable pair 133 has been calculated, the alternating current characteristics of the cable 133 are preferably measured in the same manner as described with reference to FIG. 3. The balance of the cable pair 133, that is, the presence of any unsymmetrical leakage resistance to ground from one or the other of the two wires of the pair 133, is then preferably measured by adjusting the position of the wiper of potentiometer 130 until the readings obtained on the direct current voltmeters 131, 132 are equal. The extent to which the position of the wiper deviates from the center of the potentiometer 130 is an indication of the magnitude of the unbalance. This completes the testing procedure, and the access switch 111 is preferably released from its actuated position, returning the circuit to its normal operation.

Figure 6:
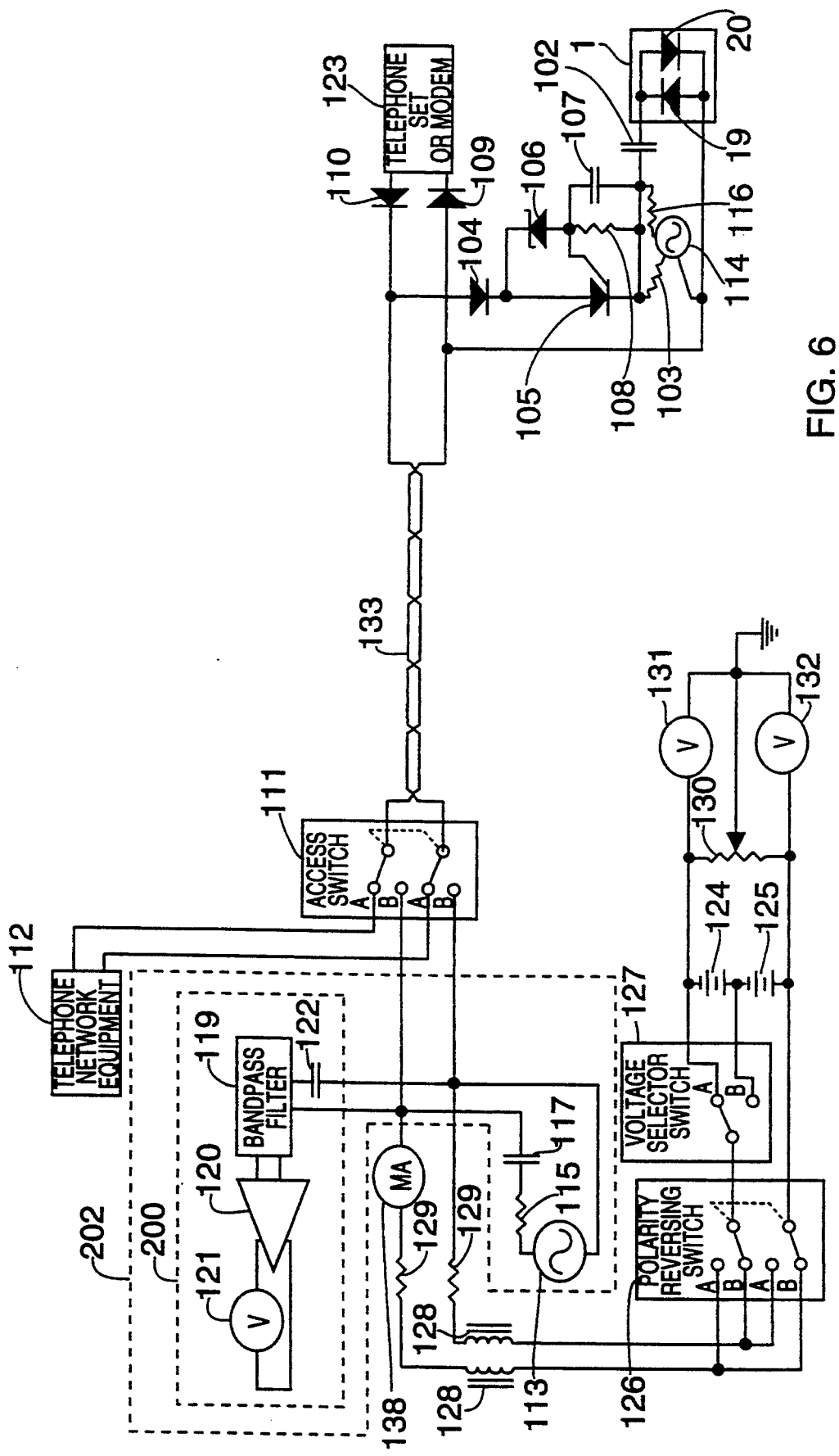
FIG. 6 is a block diagram, partially in schematic, of an alternative embodiment of the system shown in FIG. 5, with the excitation signal generator located at the far end.

As shown in FIG. 6, it is readily foreseen that excitation signal generator 114 may be located at the far end of the cable with the non-linear element, with no change in the overall function of the device.

If desired, rather than measuring the characteristics of a cable pair, the present invention may be utilized merely to detect the presence of a voltage sensitive non-linear device 1 at the far end of a cable pair wherein the voltage sensitive non-linear device is employed as a "tag" since it will provide a unique known frequency return in response to a test signal when it has been excited by the excitation signal to drive it into its non-linear region. Such an arrangement could, for example, be employed to identify the presence of something specific attached to the cable or to identify the type of cable or its particular usage, by way of example.

Thus, the present invention in which a voltage sensitive non-linear device which is employed at the far end of a cable can be excited from the near end to drive it into its non-linear region for testing purposes has a wide range of applications which come within the spirit and scope of the present invention without departing from it.

I claim:

1. A system for measuring the characteristics of a communications line, said communications line having a near end and a far end and being capable of transmitting communications signals between said near end and said far end, said system comprising:

voltage sensitive non-linear means connected to said communications line and disposed at said far end of said communications line, said voltage sensitive non-linear means having a non-linear region;

excitation signal generation means connected to said communications line for providing an excitation signal of sufficient amplitude to said voltage sensitive non-linear means for driving said voltage sensitive non-linear means into its non-linear region, said excitation signal having a voltage level larger than normal voltage levels used to transmit said communication signals through said communications line;

test signal generation means disposed at said near end and connected to said communications line for providing a test signal to said communications line at a measurement frequency, said test signal not contributing significantly to the non-linearity of said voltage sensitive non-linear means, said voltage sensitive non-linear means harmonically mixing said excitation signal and said test signal and causing a new frequency to be generated at said far end of said communications line, said generated new frequency traveling from said far end to said near end of said communications line for providing a measurement signal to said near end from said far end; and frequency selective measuring means connected to said communications line and disposed at said near end of said communications line for measuring said measurement signal provided thereto for enabling a comparison of a known calibration signal against said generated new frequency for determining said characteristics of said communications line.

2. A measurement system in accordance with claim 1 wherein said excitation signal generation means is disposed at said near end.

3. A measurement system in accordance with claim 1 wherein said excitation signal generation means is disposed at said far end.

4. A measurement system in accordance with claim 1 wherein said communications line comprises a telephone cable pair.

5. A measurement system in accordance with claim 1 wherein said communications line comprises a cable television cable pair.

6. A measurement system in accordance with claim 1 wherein said communications line comprises a data communications network cable pair.

7. A measurement system in accordance with claim 1 wherein said measurement signal has associated measurable characteristics, said frequency selective measuring means comprising means for measuring said measurable characteristics, said measurable characteristics comprising a product of known original characteristics of said excited voltage sensitive non-linear means corresponding to said known calibration signal and the characteristics of said communications line.

8. A measurement system in accordance with claim 1 wherein said frequency selective measuring means comprises a frequency selective voltmeter.

9. A measurement system in accordance with claim 7 wherein said frequency selective measuring means comprises a frequency selective voltmeter.

10. A measurement system in accordance with claim 1 wherein said voltage sensitive non-linear means comprises a diode pair connected in parallel with their forward directions opposite to each other and with said diode pair being connected in parallel with a resistive impedance.

11. A measurement system in accordance with claim 9 wherein said voltage sensitive non-linear means comprises a diode pair connected in parallel with their forward directions opposite to each other and with said diode pair being connected in parallel with a resistive impedance.

12. A measurement system in accordance with claim 1 wherein said voltage sensitive non-linear means comprises a diode connected across said communications line.

13. A measurement system in accordance with claim 4 wherein the amplitude of said excitation signal is insufficient to cause a ringing of a telephone connected to said communications line.

14. A measurement system in accordance with claim 1 further comprising:
  a DC current source disposed at said near end for generating a DC loop current on said communications line;
  current measuring means disposed at said near end for measuring the loop current through said communications line for determining the DC characteristics of said communications line.

15. A measurement system in accordance with claim 10 further comprising:
  DC current preventing means in series with said parallel diodes for preventing a flow of DC current through said parallel diodes;
  a DC current source disposed at said near end for generating a DC loop current on said communications line through said resistance;
  current measuring means disposed at said near end for measuring the loop current through said communications line for determining the DC characteristics of said communications line.

16. A measurement system in accordance with claim 11 further comprising:
  DC current preventing means in series with said parallel diodes for preventing a flow of DC current through said parallel diodes;
  a DC current source disposed at said near end for generating a DC loop current on said communications line through said resistance;
  current measuring means disposed at said near end for measuring the loop current through said communications line for determining the DC characteristics of said communications line.

17. A measurement system in accordance with claim 15 wherein said DC current preventing means comprises capacitive means.

18. A measurement system in accordance with claim 16 wherein said DC current preventing means comprises capacitive means.

19. A measurement system in accordance with claim 1 further comprising first switching means disposed at said far end for switching said voltage sensitive non-linear means from an isolated condition in which said voltage sensitive non-linear means is electrically isolated from said communications line to a non-isolated condition in which said voltage sensitive non-linear means is electrically connected to said communications line, said first switching means connecting said voltages sensitive non-linear means to said communications line in response to an excitation signal of a level corresponding to a switching level for said first switching means, said first switching means electrically isolating said voltage sensitive non-linear means from said communications line when the signal on said communications line is less than said switching level.

20. A measurement system in accordance with claim 14 further comprising first switching means disposed at said far end for switching said voltage sensitive non-linear means from an isolated condition in which said voltage sensitive non-linear means is electrically isolated from said communications line to a non-isolated condition in which said voltage sensitive non-linear means is electrically connected to said communications line, said first switching means connecting said voltages sensitive non-linear means to said communications line in response to an excitation signal of a level corresponding to a switching level for said first switching means, said first switching means electrically isolating said voltage sensitive non-linear means from said communications line when the signal on said communications line is less than said switching level.

21. A measurement system in accordance with claim 15 further comprising first switching means disposed at said far end for switching said voltage sensitive non-linear means from an isolated condition in which said voltage sensitive non-linear means is electrically isolated from said communications line to a non-isolated condition in which said voltage sensitive non-linear means is electrically connected to said communications line, said first switching means connecting said voltages sensitive non-linear means to said communications line in response to an excitation signal of a level corresponding to a switching level for said first switching means, said first switching means electrically isolating said voltage sensitive non-linear means from said communications line when the signal on said communications line is less than said switching level.

22. A measurement system in accordance with claim 21 wherein said first switching means comprises a zener diode.

23. A measurement system in accordance with claim 19 further comprising DC switching means disposed at said far end for switching said DC current flow on and off responsive to a corresponding switching of said first switching means.

24. A measurement system in accordance with claim 20 further comprising DC switching means disposed at said far end for switching said DC current flow on and off responsive to a corresponding switching of said first switching means.

25. A measurement system in accordance with claim 21 further comprising DC switching means disposed at said far end for switching said DC current flow on and off responsive to a corresponding switching of said first switching means.

26. A measurement system in accordance with claim 23 wherein said DC switching means comprises a silicon controlled rectifier.

27. A measurement system in accordance with claim 1 further comprising an isolation circuit connected to said communications line and disposed toward said far end for electrically isolating a device connected to said communications line at said far end in the presence of said excitation signal.

28. A measurement system in accordance with claim 14 further comprising an isolation circuit connected to said communications line and disposed toward said far end for electrically isolating a device connected to said communications line at said far end in the presence of said excitation signal, said isolation circuit isolating said device from said excitation signal, said test signal and said DC current when said measuring system is in a testing state, and being transparent to a ringing signal on said communications line when said measuring system is in a normal state.

29. A measurement system in accordance with claim 19 further comprising an isolation circuit connected to said communications line and disposed toward said far end for electrically isolating a device connected to said communications line at said far end in the presence of said excitation signal, said isolation circuit isolating said device from said excitation signal, said test signal and said DC current when said measuring system is in a testing state, and being transparent to a ringing signal on said communications line when said measuring system is in a normal state.

30. A measurement system in accordance with claim 23 further comprising an isolation circuit connected to said communications line and disposed toward said far end for electrically isolating a device connected to said communications line at said far end in the presence of said excitation signal, said isolation circuit isolating said device from said excitation signal, said test signal and said DC current when said measuring system is in a testing state, and being transparent to a ringing signal on said communications line when said measuring system is in a normal state.

31. A measurement system in accordance with claim 28 wherein said isolation circuit comprises a diode in parallel with a transistor circuit configured so that the impedance of the circuit is high in the presence of a reverse DC voltage, it remains low for reverse voltages caused by the presence of AC voltage.

32. A method for measuring the characteristics of a communications line having a near end and a far end and being capable of transmitting communication signals between said near end and said far end at normal voltage levels, said method comprising the steps of:
terminating said far end of said communications line with a voltage sensitive non-linear means having a linear region and a non-linear region, said voltage sensitive non-linear means;
exciting said voltage sensitive non-linear means with an excitation signal of sufficient amplitude to drive said voltage sensitive non-linear means into its non-linear region, said excitation signal having a voltage level larger than said normal voltage levels used to transmit said communication signals through said communications line;
providing at least one low level test signal to said communications line at an associated measurement frequency during a time when said voltage sensitive non-linear means is in its non-linear region, said test signal not contributing significantly to the non-linearity of said voltage sensitive non-linear means; said provided at least one test signal being harmonically mixed with said excitation signal and causing a new frequency to be generated at said far end of said communications line while said voltage sensitive non-linear means is in its non-linear region, said generated new frequency comprising a measurement signal, said measurement signal traveling from said far end to said near end of said communications line; and
frequency selective measuring said measurement signal provided to said near end and comparing a known calibration signal against said generated new frequency for determining said characteristics of said communications line based thereon.

33. A measurement method in accordance with claim 32 wherein said exciting step comprises the step of exciting said voltage sensitive non-linear means from said near end.

34. A measurement method in accordance with claim 32 wherein said exciting step comprises the step of exciting said voltage sensitive non-linear means from said far end.

35. A measurement method in accordance with claim 32 wherein said communications line comprises a telephone cable pair, said exciting step comprising the step of exciting said voltage sensitive non-linear means with an excitation signal having a voltage level larger than said normal voltage levels used to transmit telephone signals through said telephone cable pair, and said excitation signal having a voltage insufficient to cause a ringing of a telephone connected to said telephone cable.

36. A measurement method in accordance with claim 32 wherein said communications line comprises a cable television pair, said exciting step comprising the step of exciting said voltage sensitive non-linear means with an excitation signal having a voltage level larger than said normal voltage levels used to transmit cable television signals through said cable television pair.

37. A measurement method in accordance with claim 32 wherein said communications line comprises a data communications network cable pair, said exciting step comprising the step of exciting said voltage sensitive non-linear means with an excitation signal having a voltage level larger than said normal voltage levels used to transmit data communications signals through said data communications network cable pair.

38. A measurement method in accordance with claim 32 wherein said voltage sensitive non-linear means comprises a diode pair connected in parallel with their forward directions opposite to each other.

39. A measurement method in accordance with claim 32 further comprising the steps of:
providing a DC current in said communications line corresponding to a loop current through said communications line; and
measuring the current through said communications line and determining the DC characteristics of said communications line.

40. A measurement method in accordance with claim 39 further comprising the steps of:
switching said voltage sensitive non-linear means from an isolated condition in which said voltage sensitive non-linear means is electrically isolated from said communications line to a non-isolated condition in which said voltage sensitive non-linear means is electrically connected to said communications line, said switching step comprising connecting said voltages sensitive non-linear means to said communications line in response to an excitation signal of a level corresponding to a switching level for said first switching means, and electrically isolating said voltage sensitive non-linear means from said communications line when the signal on said communications line is less than said switching level.

41. A measurement method in accordance with claim 32 further comprising the steps of:
switching said voltage sensitive non-linear means from an isolated condition in which said voltage sensitive non-linear means is electrically isolated from said communications line to a non-isolated condition in which said voltage sensitive non-linear means is electrically connected to said communications line, said switching step comprising connecting said voltages sensitive non-linear means to said communications line in response to an excitation signal of a level corresponding to a switching level for said first switching means, and electrically isolating said voltage sensitive non-linear means from said communications line when the signal on said communications line is less than said switching level.

42. A measurement method in accordance with claim 40 further comprising the step of switching said DC current flow on and off responsive to a corresponding switching of said first switching means.

43. A measurement method in accordance with claim 32 further comprising isolating a device connected to said communications line at said far end in the presence of said excitation signal.

44. A measurement method in accordance with claim 41 further comprising isolating a device connected to said communications line at said far end in the presence of said excitation signal.

45. A measurement method in accordance with claim 42 further comprising isolating a device connected to said communications line at said far end in the presence of said excitation signal.

46. A system for detecting the presence of a non-linear device on a communications line, said communications line having a near end and a far end and being capable of transmitting signals between said near end and said far end, said system comprising:
voltage sensitive non-linear means connected to said communications line and disposed at said far end of said communications line, said voltage sensitive non-linear means having a linear region and a non-linear region;
excitation signal generation means connected to said communications line for providing an excitation signal of sufficient amplitude to said voltage sensitive non-linear means for driving said voltage sensitive non-linear means into its non-linear region; test signal generation means connected to said communications line and disposed at said near end of said communications line for providing at least one test signal to said communications line; said test signal not contributing significantly to the non-linearity of said voltage sensitive non-linear means, said non-linearity of said voltage sensitive non-linear means appearing at said communications line far end as a result of harmonic mixing of said excitation signal and said test signal causing a new frequency to be generated at said far end of said communications line as a result of said provided at least one test signal, said generated new frequency traveling from said far end to said near end of said communications line for providing a detection signal to said near end from said far end; and
detection means at said near end for detecting said detection signal provided to said near end from said far end.

47. A system according to claim 36 wherein said voltage sensitive non-linear device means comprises a diode pair connected in parallel with their forward directions opposite to each other and with said diode pair being connected in parallel with a resistive impedance.

* * * * *